United States Patent
Cukur et al.

(10) Patent No.: US 7,439,740 B1
(45) Date of Patent: Oct. 21, 2008

(54) ARTIFACT REDUCTION IN STEADY-STATE FREE PRECESSION IMAGING

(75) Inventors: Tolga Cukur, Stanford, CA (US); Dwight G. Nishimura, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/800,414

(22) Filed: May 4, 2007

(51) Int. Cl.
*G01V 3/00* (2006.01)

(52) U.S. Cl. .................................. 324/309; 324/307

(58) Field of Classification Search ............... 324/309, 324/307; 600/410
See application file for complete search history.

(56) References Cited

U.S. PATENT DOCUMENTS

| | | | |
|---|---|---|---|
| 5,170,122 A | 12/1992 | Bernstein | |
| 6,586,933 B1 | 7/2003 | Hardy et al. | |
| 6,624,630 B1 | 9/2003 | Foxall | |
| 6,714,807 B2 | 3/2004 | Zur | |
| 6,750,651 B2 | 6/2004 | Overall | |
| 6,794,867 B1 * | 9/2004 | Block et al. | 324/307 |
| 6,906,516 B2 | 6/2005 | Bangerter et al. | |
| 7,009,395 B2 | 3/2006 | Dixon et al. | |
| 7,148,685 B2 * | 12/2006 | Block et al. | 324/307 |
| 2005/0030023 A1 * | 2/2005 | Bangerter et al. | 324/307 |

OTHER PUBLICATIONS

Haake et al., "Steady-state free precession imaging in the presence of motion: Application for improved visualization of the cerebrospinal fluid", Radiology, 1990; 175:545-552.
Vasanawala et al., "Linear combination steady-state free precession MRI", Magn Reson Med, 2000; 43:82-90.
Bangerter et al., "Analysis of multiple-acquisition SSFP", Magn Reson Med, 2004; 51:1038-1047.
Cukur et al., "Magnitude-Weighted Complex-Sum SSFP", Proceedings of the Joint Annual Meeting ISMRM-ESMRMB 2007, p. 1648.

* cited by examiner

*Primary Examiner*—Louis M Arana
(74) *Attorney, Agent, or Firm*—Beyer Law Group LLP (57) ABSTRACT

A method of reducing artifacts in steady-state free precession (SSFP) signals for use in magnetic resonance imaging is provided. A plurality of SSFP imaging sequences is applied to an object. An imaging data for each of the SSFP imaging sequences is acquired. The imaging data is combined using a weighted combination where weights depend on a control parameter that adjusts a trade-off between banding artifact reduction and signal to noise ratio (SNR).

19 Claims, 8 Drawing Sheets

ARTIFACT REDUCTION IN STEADY-STATE FREE PRECESSION IMAGING

GOVERNMENT RIGHTS

The U.S. government has rights in the disclosed invention pursuant to NIH grants to Stanford University including 5R01_HL075803, and 5R01_HL039297.

BACKGROUND OF THE INVENTION

This invention relates generally to magnetic resonance imaging (MRI), and more particularly, the invention relates to MRI using steady-state free precession (SSFP) with image artifact reduction.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Balanced steady-state free precession (SSFP) sequences have gained popularity in magnetic resonance imaging (MRI) as they can yield high signal-to-noise ratios (SNR) within very short scan times. However, there are several problems limiting the applicability of SSFP imaging. The balanced SSFP signal is a function of the local resonant frequency, leading to characteristic signal nulls/voids (known as banding artifacts) in regions of large resonant frequency variation. Furthermore, the bright lipid signal is often undesired.

At higher field strengths or with longer repetition times (TR), the banding artifacts become more pronounced. It is therefore necessary to limit the off-resonance frequency variation to approximately 2/(3*TR) to avoid any banding artifacts. However, it is not always possible to limit the repetition time as specific absorption rate (SAR) considerations and resolution requirements may place constraints on the minimum TR. A longer minimum TR due to increased power deposition and resonant frequency variations at higher fields can potentially lead to severe banding artifacts.

A common strategy to reduce these artifacts has been to acquire a plurality of SSFP images, where the radio-frequency (RF) pulse phase increment between successive TRs is changed with each acquisition to shift the spectral response of the signal. Several methods for combining these multiple acquisitions have been proposed, including maximum-intensity (MI), complex-sum (CS), and magnitude-sum and sum-of-squares (SOS) combinations. The complex-sum method aims to reduce banding artifacts but is far from optimal in terms of SNR efficiency. On the other hand, the magnitude-sum and sum-of-squares methods yield higher SNR efficiencies but provide less robust suppression of banding artifacts.

SUMMARY OF THE INVENTION

In accordance with the invention, a method of reducing artifacts in steady-state free precession (SSFP) signals for use in magnetic resonance imaging is provided. A plurality of SSFP imaging sequences is applied to an object. An imaging data for each of the SSFP imaging sequences is acquired. The imaging data is combined using a weight combination in which weights depend on a control parameter that adjusts a trade-off between banding artifact reduction and signal-to-noise ratio (SNR).

In another manifestation of the invention a method comprises applying a plurality of SSFP imaging sequences to an object to be imaged, acquiring imaging data for each of the SSFP imaging sequences, and combining the imaging data using a formula $$Y = \left| \sum_{n=1}^{N} |X_n|^p X_n \right|^{\left(\frac{1}{1+p}\right)},$$

where Y is the image, N is a number of SSFP images, $X_n$ is a complex variable for an SSFP image of the plurality of SSFP images, and p is the control parameter, where p is in the range $[1, \infty)$. The combined image data is displayed.

In another manifestation of the invention provides an apparatus comprising a magnet system and a controller electrically connected to the magnet system, which comprises a display, at least one processor, and computer readable media. The computer readable media comprises computer readable code for applying a plurality of SSFP imaging sequences to an object to be imaged, computer readable code for acquiring imaging data for each of the SSFP imaging sequences, and computer readable code for combining the imaging data using a weighted combination in which weights depend on a control parameter that adjusts a trade-off between banding artifact reduction and signal to noise ratio (SNR).

The invention and objects and features thereof will be more readily apparent from the following detailed description and appended claims when taken with the drawings.

DETAILED DESCRIPTION OF ILLUSTRATED EMBODIMENTS

Figure 1A:
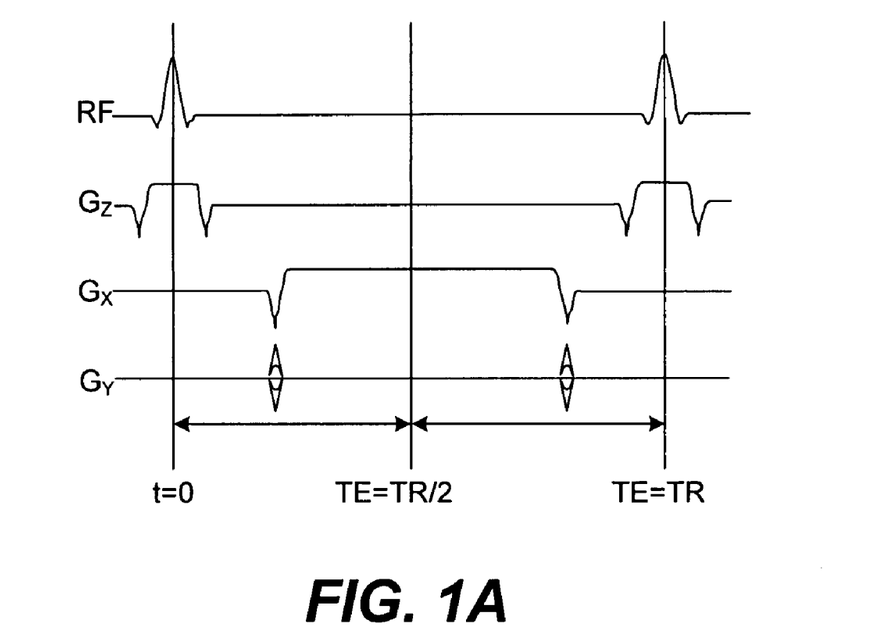
FIGS. 1A, 1B illustrate a SSFP phase sequence.
Figure 1B:
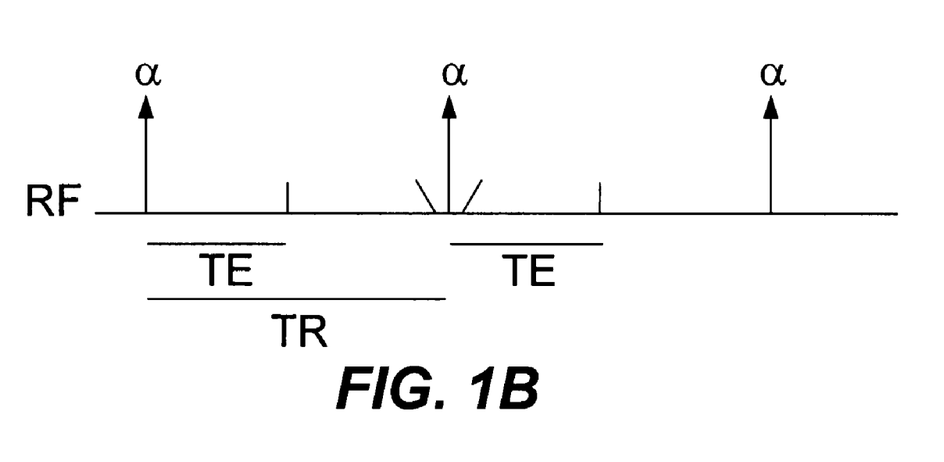

As illustrated in FIGS. 1A, 1B, a refocused SSFP sequence includes a single RF excitation which is repeated periodically.

All gradients used for slice selection or imaging are fully rewound over each repetitive time, TR. In the steady-state, the magnetization at points a and d are the same.

Magnetization is tipped about a traverse axis through an angle $\alpha$. Between excitations, the magnetization undergoes a precession by an angle $\theta=2\pi\Delta fTR$ about the z-axis (direction of B0), where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle ($\alpha$), repetition time (TR) and echo time (TE) as well as the tissue parameters T1, T2, and resonant frequency shift $\Delta f$.

Figure 2:
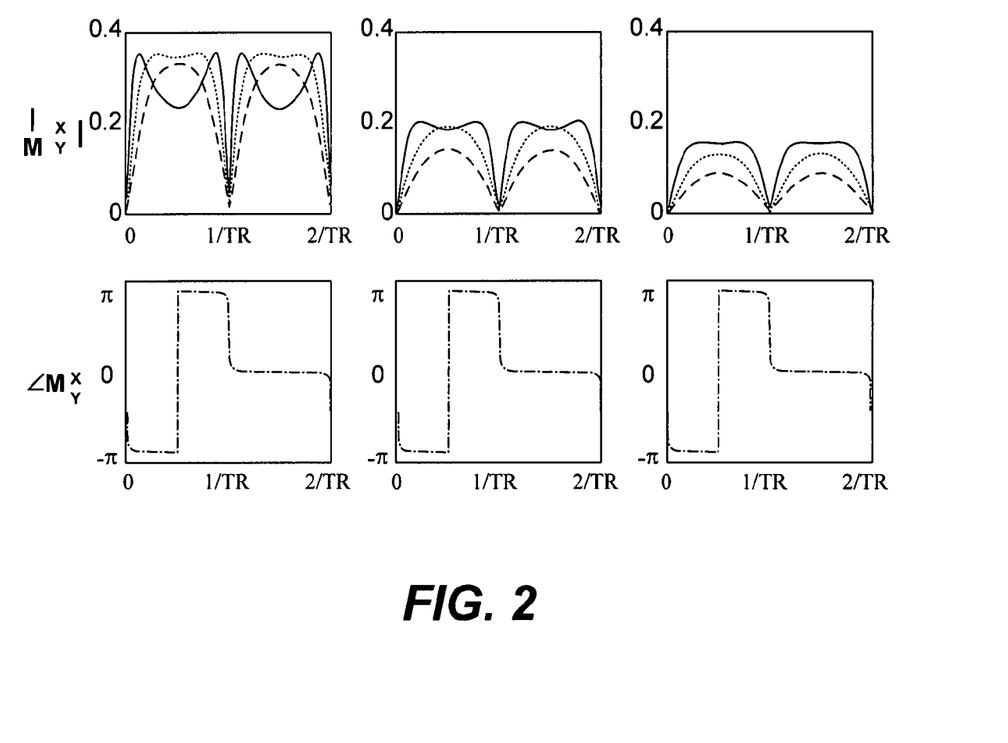
FIG. 2 illustrates SSFP transverse magnetization and phase as a function of off-resonance frequency for a SSFP signal profile.

Signal readout is performed each period, with low spatial frequency information acquired at an echo time TE typically spaced midway between the RF excitation pulses. The resultant steady-state MR signal is a strong function of the local resonant frequency, as shown in FIG. 2, which shows magnetization or signal profiles (i.e., off-resonance spectra). SSFP transverse magnetization magnitude (top) and phase (bottom) are shown as a function of off-resonant frequency. Each graph shows three different tip angles: the solid line corresponds to a 30° tip angle, the dotted line 60°, and the dashed line 90°. Profiles are shown for three different T1/T2 combinations: T1/T2=200/100 ms (left), T1/T2=600/100 ms (middle), and T1/T2=1000/100 ms (right). TE=TR/2 in all cases. The periodic nulls in the signal profile, separated by a frequency of 1/TR, are the source of off-resonance banding artifacts.

If the phase $\phi$ of the RF excitation pulse is incremented by a constant value $\Delta\phi$ from excitation to excitation ("phase cycling"), the magnetization profile is shifted in off-resonance frequency by $\Delta\phi/(2\pi \cdot TR)$. The maximum-intensity, complex-sum and sum-of-squares combination methods make use of N individual image acquisitions, each acquisition employing $\Delta\phi=2\pi n/N$, where n=1, ..., N. The resultant shift in magnetization profile is exploited in each case to eliminate the signal nulls in the reconstructed image. A maximum-intensity image is formed by choosing the brightest pixel at each point from the corresponding pixel in each of the N phase-cycled acquisitions. See Haacke et al., Radiology 1990; 175: 545-552. A complex-sum technique consists in simply summing the complex reconstructed images from each acquisition. See Vasanawala et al., Magn. Reson. Med. 2000; 43: 82-90. A sum-of-squares combination sums the squares of the reconstructed magnitude images from each acquisition and takes the square root of the result. See Bangerter et al., Magn. Reson. Med. 2004; 51: 1038-1047.

A novel method (weighted combination SSFP or WC-SSFP) for combining a plurality of SSFP images with different RF phase increments for improved shaping of the SSFP profile is proposed and its applicability to banding artifact reduction is demonstrated. This method approaches the SNR efficiency of the SOS method, while reducing the banding artifacts as effectively as the complex-sum method by weighting each SSFP dataset by a power (greater than 1) of its magnitude. The exact value of the power is a control parameter which adjusts the trade-off between banding artifact reduction and SNR efficiency, giving greater flexibility for image optimization. The favorable SNR efficiency properties and robust banding artifact reduction coupled with this flexibility to tune for specific applications will allow higher field SSFP imaging, higher resolution or reduced SAR imaging over a greater range of TRs and with reduced banding artifact.

The SSFP signal is a function of free precession per TR ($\omega$) and the spectrum displays $2\pi$-periodic (in $\omega$) nulls. There are $\pi$ radians phase jumps across these nulls. Furthermore, a constant RF phase increment ($\Delta\phi$) employed from one excitation to the next shifts the SSFP spectrum by ($\Delta\phi$) in the $\omega$-axis. Multiple-acquisition methods shape the SSFP profile by exploiting these characteristics of the SSFP signal.

The signal null in the SSFP spectrum leads to regions of signal loss in the resultant images. In addition, the homogeneity of the pass-band signal depends on the T1/T2 ratio and the flip angle $\alpha$. The challenge in banding artifact reduction is to create as flat a signal profile as possible. Multiple-acquisition methods that target removal of banding artifacts exploit several (N) SSFP datasets, where the $n^{th}$ dataset is acquired with an RF phase increment $\Delta\phi=2\pi n/N$ radians. The aforementioned methods are different in the way they combine these datasets. The CS method yields robust banding artifact reduction; however, phase incoherences across the datasets lead to signal loss and reduced SNR efficiency. The SOS technique weights each dataset by its own magnitude for optimal SNR properties, assuming the individual datasets are uncorrelated. Nonetheless, its banding removal performance does not match that of the CS method.

Figure 3:
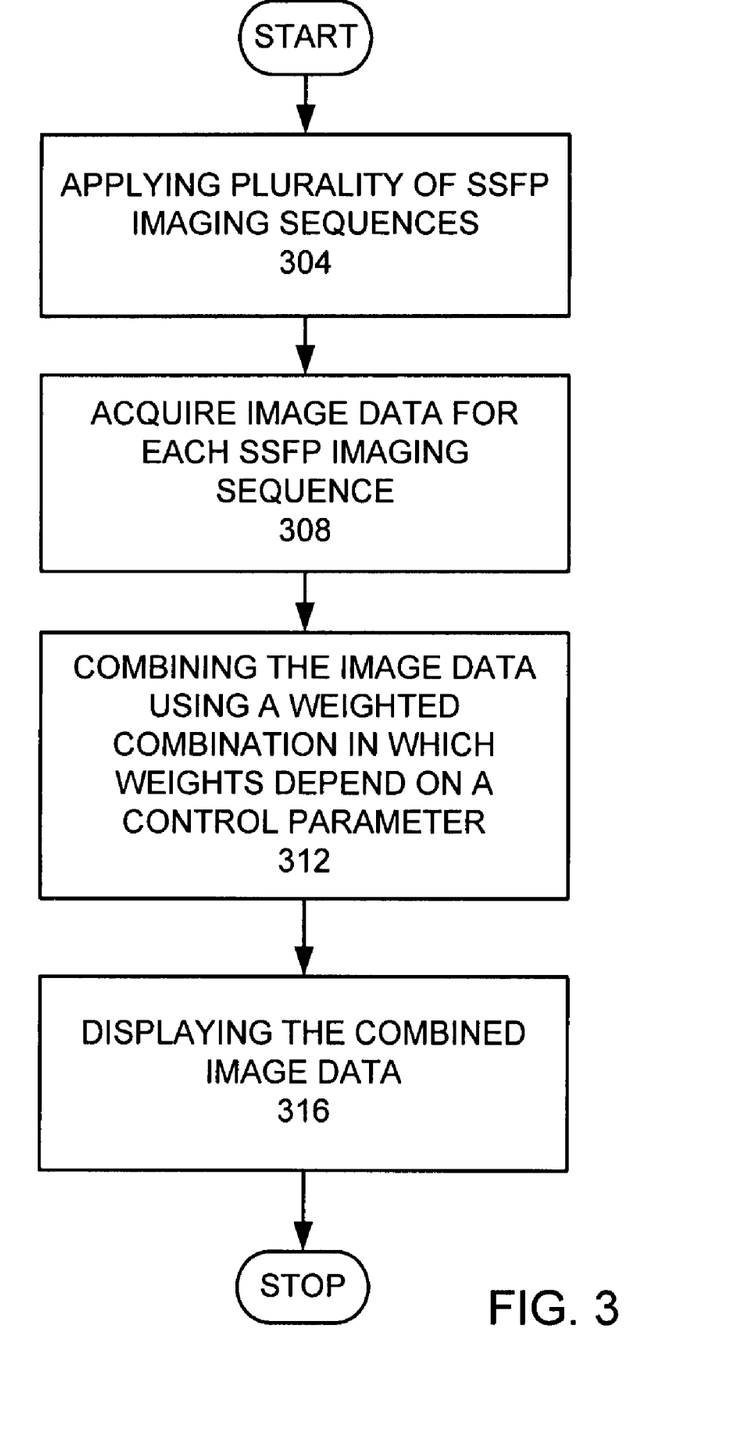
FIG. 3 is a high level flow chart of an embodiment of the invention.

FIG. 3 is a high level flow chart of an embodiment of the invention. A plurality of SSFP imaging sequences is applied to an object (step 304). Imaging data is acquired for each of the SSFP imaging sequences (step 308). The imaging data is combined using a weight combination in which the weights depend on a control parameter (step 312). The combined imaging data is displayed (step 316).

EXAMPLES

Figure 4:
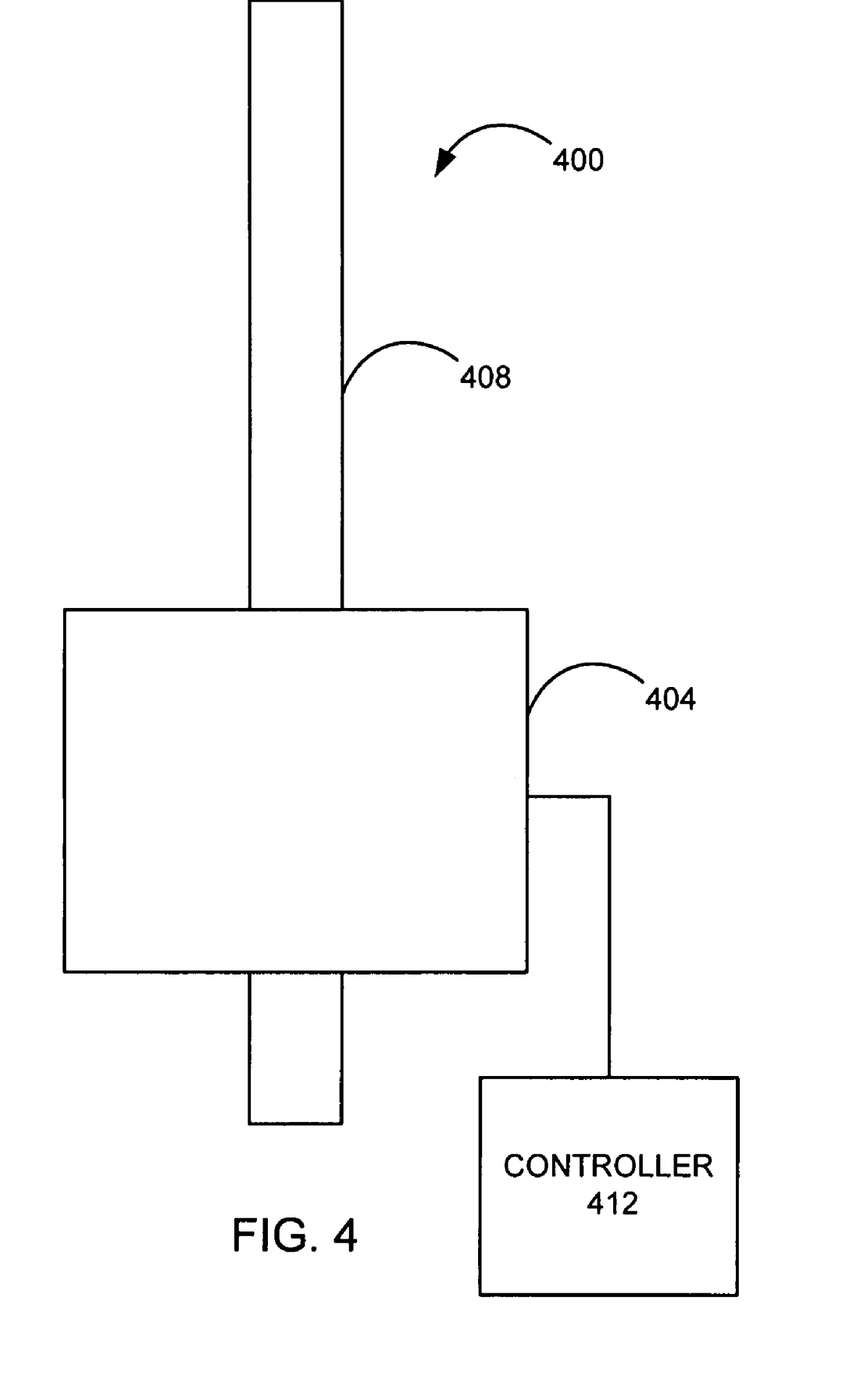
FIG. 4 is a schematic top view of a magnetic resonance imaging (MRI) system that may be used in an embodiment of the invention.

FIG. 4 is a schematic top view of a magnetic resonance imaging (MRI) system 400 that may be used in an embodiment of the invention. The MRI system 400 comprises a magnet system 404, a patient transport table 408 connected to the magnet system, and a controller 412 controllably connected to the magnet system. In one example, a patient would lie on the patient transport table 408 and the magnet system 404 would pass around the patient. The controller 412 would control magnetic fields and radio frequency (RF) signals provided by the magnet system 404 and would receive signals from detectors in the magnet system 404.

Figure 5A:
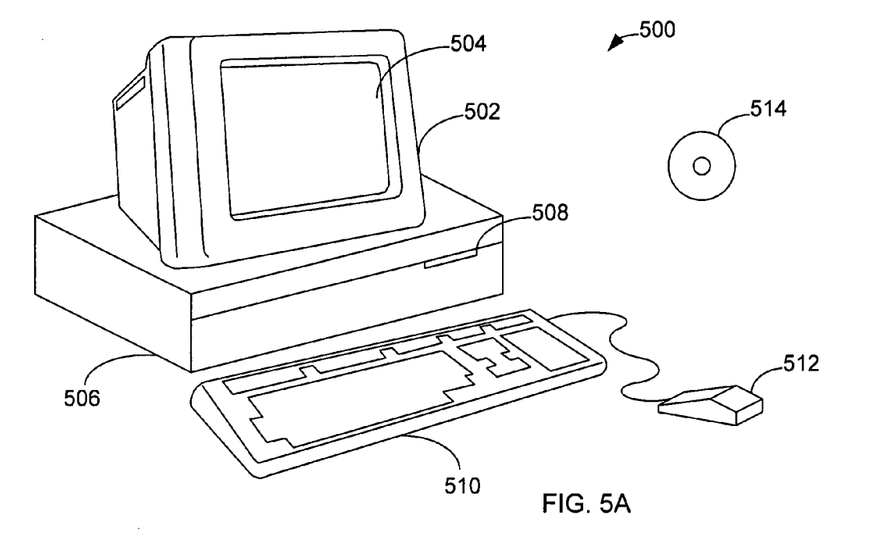
FIGS. 5A and 5B illustrate a computer system that may be used in an embodiment of the invention.

FIGS. 5A and 5B illustrate a computer system 500, which is suitable for implementing a controller 412 used in embodiments of the present invention. FIG. 5A shows one possible physical form of the computer system. Of course, the computer system may have many physical forms ranging from an integrated circuit, a printed circuit board, and a small hand-held device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

Figure 5B:
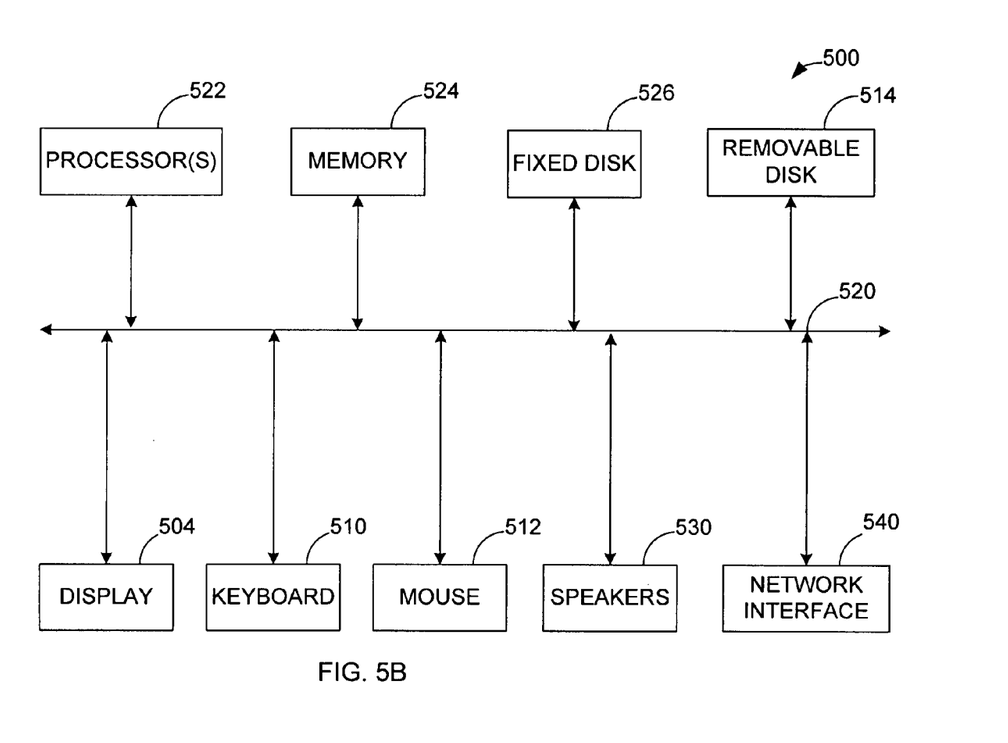

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In a more specific example, the above apparatus is used. The controller 412 signals the magnet system 404 to apply a plurality of SSFP imaging sequences to an object to be imaged in the magnet system 404 (step 304). The magnet system 404 acquires imaging data for each of the SSFP imaging sequences (TE) (step 308).

The controller 412 combines the imaging data using a weighted combination in which the weights depend on a control parameter (step 312). An embodiment of the invention provides a weighted combination of the complex-valued images instead of a weighted combination of the magnitude images, in which the weights are based on images themselves raised to a power and in which the power is a control parameter p. An example of this embodiment is a hybrid of earlier mentioned techniques that tries to preserve the favorable properties of each method. Assuming there are N separate SSFP images, the $n^{th}$ image being $X_n$, the resulting image Y can be expressed as, $$Y = \left| \sum_{n=1}^{N} |X_n|^p X_n \right|^{\left(\frac{1}{1+p}\right)} \qquad \text{Eq. 1}$$

where p is the control parameter mentioned previously and p is in the range $[1, \infty)$. The final raising to the $$\left(\frac{1}{1+p}\right)^{th}$$

power is necessary to restore the initial image contrast, which is modified by the magnitude-to-a-power weighting of the individual data sets. The optimal SNR is achieved when p=1, similar to SOS combination. However, this embodiment sums complex SSFP signals weighted by their magnitudes when p=1, as opposed to the square of the magnitudes in SOS combination. As a consequence, the method achieves more robust banding artifact reduction than the SOS method. If the parameter p is increased, the banding artifact reduction improves at the expense of SNR efficiency. For very large p, the weighted complex-sum method approaches the maximum-intensity method. When p=0, the method is equivalent to CS combination.

The formalism outlined in Bangerter N K, Hargreaves B A, Vasanawala S S, Pauly J M, Gold G E, Nishimura D G., "Analysis of multiple-acquisition SSFP," Magn Reson Med 2004; 51.1038-1047. was used for a quantitative comparison between their proposed method (SOS) and the then-existing methods (MI,CS). In this formalism, each of the multiple SSFP acquisitions is modeled as a bivariate Gaussian random variable, $$X_n = \mu_n + N(0, \sigma_n^2) + iN(0, \sigma_n^2) \qquad \text{Eq. 2}$$

where $\mu_n$ is the complex mean, $\sigma_n$ is the standard deviation of the random variable $X_n$ and $N(0,\sigma_n^2)$ is a Gaussian random variable. It is important to note that the off-resonance frequency dependence of $X_n$ is embedded in $\mu_n$. Since the resulting image, Y, of any combination method can be expressed as a function of random variables $X_{1,\ldots,N}$, the mean ($\mu_Y$) and the standard deviation ($\sigma_Y$) of Y can be computed as a function of resonant frequency.

The SNR of the resulting image is then given by:

$$SNR(\omega) = \frac{\mu_{Y(\omega)}}{\sigma_{Y(\omega)}} \qquad \text{Eq. 3}$$

where $\omega$ is the resonant frequency in radians/TR. An average measure for SNR is more useful as the actual frequency variation for a given voxel is not known a priori, $$\overline{SNR} = \frac{1}{4\pi} \int_0^{4\pi} SNR(\omega) d\omega \qquad \text{Eq. 4}$$

where the SNR is averaged over a period of the resonant-frequency variation.

A good measure for the banding artifact reduction of any combination method is the percent ripple of a period of the spectrum of the resulting image, $$\%\text{Ripple} = \frac{\max(\mu_Y) - \min(\mu_Y)}{\frac{1}{4\pi}\int_0^{4\pi} \mu_Y(\omega)\,d\omega} \times 100 \qquad \text{Eq. 5}$$

Simulated SSFP phantom images with two different phase-cycling schemes, namely 0-0 and 0-180, were generated to verify the theory. The phantom consisted of three strips of tissues with the following relaxation parameters: T1/T2=270/85 ms for fat, 870/47 ms for muscle and 1000/200 ms for arterial blood. An echo time (TE) of 5 ms, a TR of 10 ms and α=30° was assumed. The off-resonance frequency was linearly varied in the horizontal direction. An individual SSFP image SNR of 15 at the center of the pass-band for fat was achieved by adding bivariate Gaussian noise to the data. The images resulting from the CS, SOS and weighted combination (WC, with two different values of the parameter p) methods along with the individual SSFP images are displayed in FIGS. 6A-F.

Figures 6A, 6B:
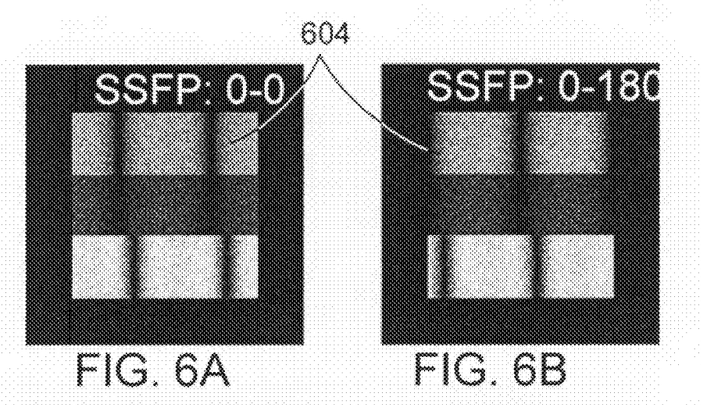
FIGS. 6A-F are individual SSFP images.
Figure 6C:
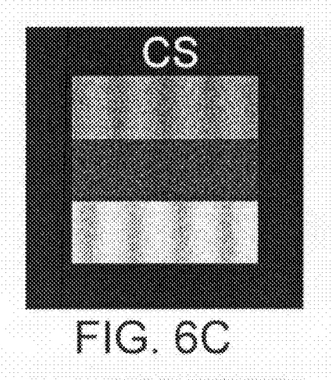
Figure 6D:
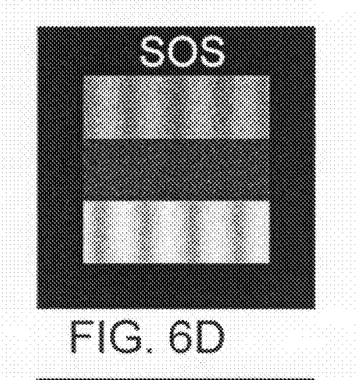
Figure 6E:
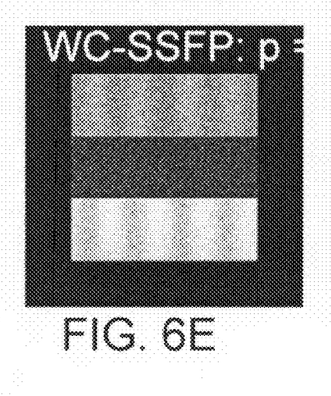
Figure 6F:
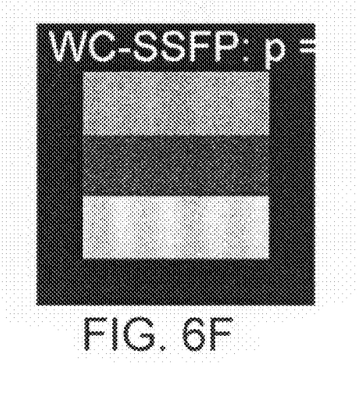

FIGS. 6A-B: are images from simulated SSFP phantoms (tissues from top to bottom are fat, muscle and arterial blood), with 0-0 (Δϕ=0) and 0-180 (Δϕ=π). The off-resonance frequency is linearly varied across the horizontal direction. FIGS. 6C-D are combination images for the CS and SOS methods. FIGS. 6E-F are WC-SSFP images with the parameter p equal to 1 and 4 respectively. The WC-SSFP method is clearly better than the CS and SOS methods at banding artifact reduction even for p=1. The ripples 604 across the spectrum, depicted as contrast variations along the strips in the phantom images, can further be reduced by increasing p at the expense of SNR efficiency as shown in FIG. 6F.

The above simulation shows that the WC-SSFP method is more successful at reducing banding artifacts than both the CS and the SOS methods, while achieving SNR close to that of the SOS method. The artifact reduction is improved with an accompanying decrease in average SNR by increasing p to 4 as expected. The percent ripple and average SNR measurements of each tissue across the spectrum with different methods are listed in Table 1.

TABLE 1

| Tissue | p = 1 | p = 4 | CS | SOS |
|---|---|---|---|---|
| Fat | 34%, 20.3 | 30%, 18.4 | 31%, 17.4 | 44%, 22.7 |
| Muscle | 16%, 8.6 | 10%, 8.1 | 24%, 7.2 | 28%, 9.2 |
| Blood | 31%, 16.4 | 22%, 15.2 | 40%, 13.5 | 44%, 18.6 |

Table 1 shows the percent ripple and SNR of three tissues in the phantom images (from FIGS. 6A-F) for the WC (p=1, 4), CS and SOS combination methods.

The CS, SOS and WC (p=1) methods were also compared in terms of percent ripple and SNR efficiency for a range of simulation parameters: α=30°, TR/TE=10/5 ms, T1=300-2000 ms and T2=50-230 ms. Simulations were performed for both N=2 and N=4, and an SNR of 15 was assumed at the center of the pass-band for a single SSFP acquisition. The results are shown in FIGS. 7A-D. The banding artifact reduction performance of the WC method is superior to the other methods' for a range of T1 and T2 values commonly found in vivo, without a substantial compromise in SNR efficiency over the optimal-SNR SOS combination.

Figure 7A:
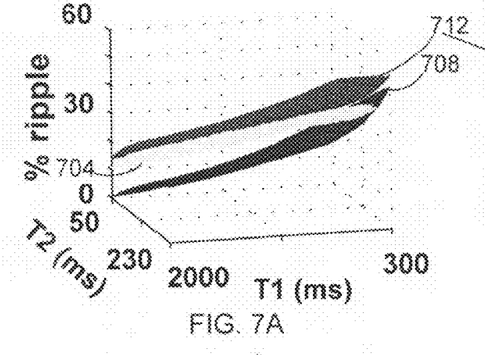
FIGS. 7A-D show the percent ripple and SNR efficiency.
Figure 7B:
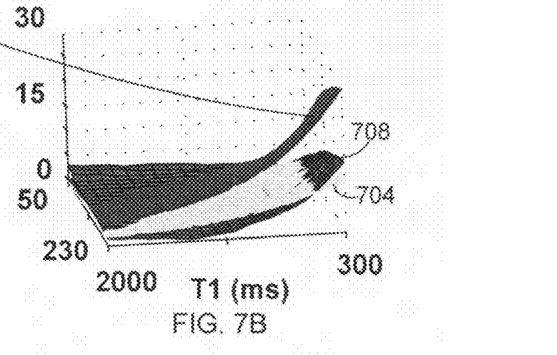
Figure 7C:
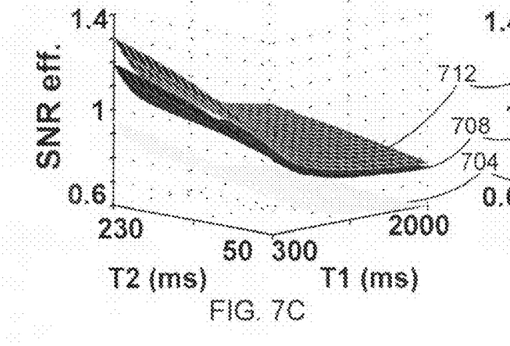
Figure 7D:
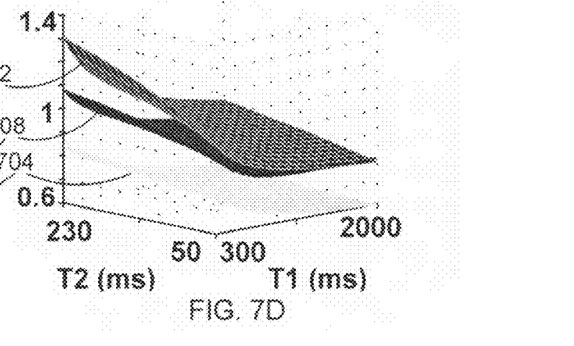

FIGS. 7A-D show the percent ripple and SNR efficiency for the CS 704 (light gray), WC (p=1) 708 (black) and SOS 712 (dark gray) methods. FIGS. 7A and C show when: N=2, assuming α=30°. FIGS. 7B and D show when N=4, assuming α=30°. For a wide range of T1,T2 values the percent ripple of the WC-SSFP technique is smaller than that for the other methods, while the SNR efficiency of the WC method is very close to the efficiency of the SNR-optimal SOS method. The improvement in banding artifact reduction over the CS and SOS methods is more pronounced with a smaller number of total acquisitions (N=2).

Figure 8A:
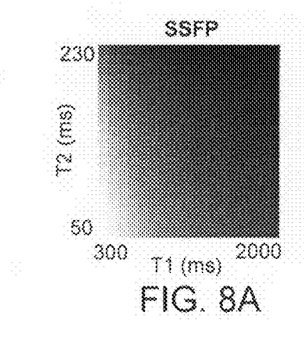
FIGS. 8A-B show the signal at the center of the pass-band for a range of T1 and T2 values.
Figure 8B:
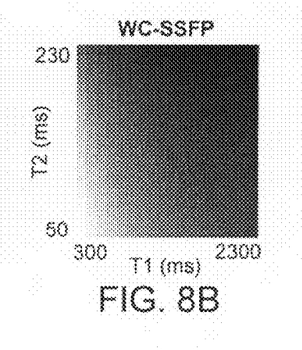

The contrast of SSFP and WC-SSFP images can be compared by computing the signal at the center of the pass-band for a range of T1 and T2 values as displayed in FIGS. 8A-B, where the signal at the pass-band center for a range of T1 and T2 values was computed for SSFP, shown in FIG. 8A, and WC-SSFP, shown in FIG. 8B, using the following simulation parameters: α=45°, TR/TE=10/5 ms and N=2 for WC-SSFP. The WC-SSFP contrast is very similar to the basic SSFP contrast.

The weighted complex-sum contrast is essentially equivalent to SSFP contrast for the range of relaxation parameters considered. Therefore, weighting the SSFP signal by a power of its magnitude prior to combination does not significantly change the basic SSFP contrast provided the power $$\left(\frac{1}{1+p}\right)$$

operation is performed.

The performance of the method was also tested with doped $MnCl_2$ phantoms. 3D balanced SSFP images of three phantoms were acquired on a 1.5 T GE Signa Excite scanner with CV/i gradients with the following parameters: α=30°, 16 cm FOV, 0.5×0.5×2 $mm^3$ resolution, TR/TE=20/10 ms, 30 kHz bandwidth and 4 different phase-cycling schemes (Δϕ=0, π/2, π, 3π/2). The relaxation parameters for the phantoms were T1/T2=1300/900, 800/375, 250/50 ms respectively. The images combined with the CS, WC and SOS methods are displayed in FIGS. 9A-C.

Figure 9A:
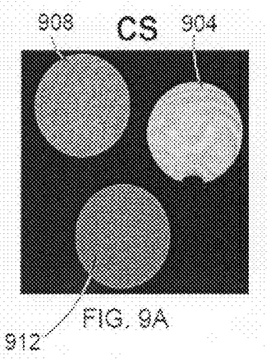
FIGS. 9A-C shows 3DFT-SSFP images of 3 phantoms.
Figure 9B:
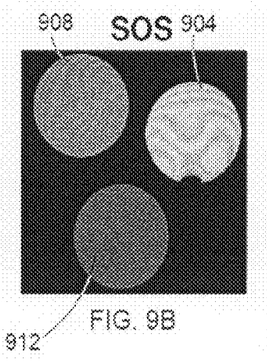
Figure 9C:
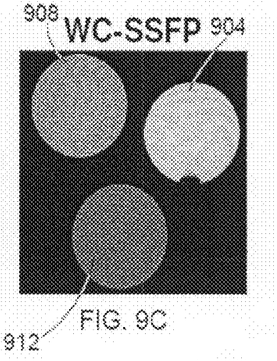

In FIGS. 9A-C shows 3DFT-SSFP images of 3 phantoms with T1/T2=1300/900 (upper-right, 904), 800/375 (upper-left, 908), 250/50 (bottom, 912) ms, were acquired with α=30°, 16 cm FOV, 0.5×0.5×2 $mm^3$ resolution, TR/TE=20/10 ms, 30 kHz bandwidth and 4 different phase-cycling schemes (Δϕ=0, π/2, π, 3π/2). Combination images are displayed for CS (FIG. 9A), SOS (FIG. 9B), and WC (FIG. 9C) (p=1) methods. The WC-SSFP method delivers the most robust banding artifact reduction with near-optimal SNR efficiency.

The WC-SSFP method achieves better banding artifact suppression than the CS and SOS combinations as shown by the less noticeable ripples, and has an SNR efficiency comparable to that of the SOS method.

The parameter p can be used to trade off SNR efficiency for banding artifact reduction when necessary. Additional flexibility in scan parameter selection, especially TR, will enable SSFP imaging at higher field strengths and with higher resolution.

Preferably, p is in the range of [1, 10]. More preferably p is in the range of [1, 10]. Most preferably, p is about 1.

Incorporated by reference for all purposes are an abstract to be published in Proceedings of the Joint Annual Meeting ISMRM-ESMRMB 2007, p. 1648, and entitled "Magnitude-Weighted Complex-Sum SSFP" by T. Cukur, N. K. Bangerter, D. G. Nishimura and a paper submitted to the Magnetic Resonance in Medicine entitled "Enhanced Spectral Shaping in Steady-State Free Precession Imaging," by T. Cukur, N. K. Bangerter, and D. G. Nishimura.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of reducing artifacts in steady-state free precession (SSFP) signals for use in magnetic resonance imaging comprising:
   a) applying a plurality of SSFP imaging sequences to an object to be imaged;
   b) acquiring imaging data for each of the SSFP imaging sequences; and
   c) combining the imaging data using a weighted combination in which weights depend on a control parameter that adjusts a trade-off between banding artifact reduction and signal to noise ratio (SNR).

2. The method, as recited in claim 1, wherein the combining the imaging data uses a weighted combination of complex-valued images in which the weights are based on images themselves and in which the power of the weight is a function of the control parameter p.

3. The method, as recited in claim 1, wherein the combining the imaging data uses the formula $$Y = \left| \sum_{n=1}^{N} |X_n|^p X_n \right|^{\left(\frac{1}{1+p}\right)},$$

where Y is the image, N is a number of SSFP images, $X_n$ is an SSFP image of the plurality of SSFP images, and p is the control parameter, where p is in the range $[1, \infty)$.

4. The method, as recited in claim 3, wherein $X_n$ is a complex variable.

5. The method, as recited in claim 4, further comprising displaying an image from the combined imaging data.

6. The method, as recited in claim 5, wherein the plurality of SSFP imaging sequences are phase-cycled.

7. The method, as recited in claim 6, wherein p is between 1 and 10 inclusive.

8. The method, as recited in claim 6, wherein the control parameter p is used to adjust a signal to noise ratio and a % Ripple.

9. The method, as recited in claim 6, wherein p is about 1.

10. The method, as recited in claim 1, further comprising displaying an image from the combined imaging data.

11. The method, as recited in claim 1, wherein the plurality of SSFP imaging sequences are phase-cycled.

12. The method, as recited in claim 3, wherein p is between 1 and 10 inclusive.

13. The method, as recited in claim 3, wherein the control parameter p is used to adjust a signal to noise ratio and a % Ripple.

14. The method, as recited in claim 3, wherein p is about 1.

15. A method, comprising:
   a) applying a plurality of SSFP imaging sequences to an object to be imaged;
   b) acquiring imaging data for each of the SSFP imaging sequences;
   c) combining the imaging data using a formula $$Y = \left| \sum_{n=1}^{N} |X_n|^p X_n \right|^{\left(\frac{1}{1+p}\right)},$$

where Y is the image, N is a number of SSFP images, $X_n$ is a complex variable for an SSFP image of the plurality of SSFP images, and p is the control parameter, where p is in the range $[1, \infty)$; and
   d) displaying an image from the combined imaging data.

16. The method, as recited in claim 15, wherein the plurality of SSFP imaging sequences are phase-cycled.

17. The method, as recited in claim 16, wherein p is between 1 and 10 inclusive.

18. The method, as recited in claim 17, wherein the control parameter p is used to adjust a signal to noise ratio and a % Ripple.

19. An apparatus, comprising:
   a magnet system;
   a controller electrically connected to the magnet system, comprising:
      a display;
      at least one processor; and
      computer readable media, comprising:
         computer readable code for applying a plurality of SSFP imaging sequences to an object to be imaged;
         computer readable code for acquiring imaging data for each of the SSFP imaging sequences; and
         computer readable code for combining the imaging data using a weighted combination in which weights depend on a control parameter that adjusts a trade-off between banding artifact reduction and signal to noise ratio (SNR).

* * * * *